(12) United States Patent
Lyu et al.

(10) Patent No.: US 12,347,714 B1
(45) Date of Patent: Jul. 1, 2025

(54) WAFER POSITIONING AND CORRECTION METHOD, SYSTEM, AND DEVICE

(71) Applicant: Hito Robotic System Inc., Chino, CA (US)

(72) Inventors: Rongsheng Lyu, Nanjing (CN); Han Zhang, Nanjing (CN); Zhichun Guo, Nanjing (CN); Zuojun Shen, Moraga, CA (US)

(*) Notice: Subject to any disclaimer, the term of this patent is extended or adjusted under 35 U.S.C. 154(b) by 0 days.

(21) Appl. No.: 19/016,609

(22) Filed: Jan. 10, 2025

(30) Foreign Application Priority Data

Jan. 12, 2024 (CN) .......................... 202410050381.8

(51) Int. Cl.
*G05B 19/404* (2006.01)
*H01L 21/68* (2006.01)

(52) U.S. Cl.
CPC .......... *H01L 21/681* (2013.01); *G05B 19/404* (2013.01); *G05B 2219/37506* (2013.01); *G05B 2219/45031* (2013.01)

(58) Field of Classification Search
None
See application file for complete search history.

(56) References Cited

U.S. PATENT DOCUMENTS

| | | | | |
|---|---|---|---|---|
| 4,887,904 A * | 12/1989 | Nakazato | .............. | H01L 21/681 414/757 |
| 5,258,823 A * | 11/1993 | Akamatsu | .............. | H01L 21/681 356/615 |
| 5,851,102 A * | 12/1998 | Okawa | .................. | H01L 21/682 414/936 |
| 6,195,619 B1 * | 2/2001 | Ren | ........................ | G03F 7/7075 702/155 |
| 6,198,976 B1 * | 3/2001 | Sundar | .................. | H01L 21/681 700/121 |
| 6,400,445 B2 * | 6/2002 | Nishi | .................. | G03F 7/70691 355/72 |
| 7,315,373 B2 * | 1/2008 | Fukuzaki | ................ | H01L 21/68 356/399 |
| 7,658,586 B2 * | 2/2010 | Niewmierzycki | .......................... | H01L 21/67742 414/217 |
| 7,933,665 B2 * | 4/2011 | Sakiya | .................. | H01L 21/681 700/121 |
| 9,218,996 B2 * | 12/2015 | Gajendra | .......... | H01L 21/67242 |
| 10,340,169 B2 * | 7/2019 | Yamamoto | ............. | G01B 11/14 |
| 12,002,695 B2 * | 6/2024 | Tan | ....................... | H01L 21/681 |
| 12,217,985 B2 * | 2/2025 | Topping | ........... | H01L 21/67748 |

(Continued)

*Primary Examiner* — Jason Lin
(74) *Attorney, Agent, or Firm* — Clement Cheng

(57) ABSTRACT

A semiconductor wafer transfer device has a wafer positioning deskewing method via steps of initially setting parameters for the size of a wafer to be measured; collecting a motor rotational angle initialization settings for the size of the wafer to be measured; collecting motor angle data $\alpha_i$ and optical calibrator optical calibrator shading length data $s_i$; calculating the wafer turning angle $\theta_i$ and the wafer edge to center of rotation distance data $\rho_i$. The distance between the edge of the wafer to be measured and the center of the rotating suction cup is determined to the center of the rotating suction cup is within the specified range.

11 Claims, 5 Drawing Sheets

(56) References Cited

U.S. PATENT DOCUMENTS

| | | | | |
|---|---|---|---|---|
| 2008/0017613 A1* | 1/2008 | Nogami | ............... | H01L 21/6708 156/345.33 |
| 2012/0224945 A1* | 9/2012 | Douki | ................ | H01L 21/6715 414/754 |
| 2014/0271085 A1* | 9/2014 | Gajendra | ............... | H01L 21/681 414/757 |
| 2019/0172738 A1* | 6/2019 | Hiester | .................. | H01L 21/68 |

* cited by examiner

```
For the dimensions of the wafer to be inspected, the preset coaxially error Δ of the
center P of the wafer to be tested and the center O of the rotary suction cup, the
radius R of the wafer to be tested, the distance $L_0$ between said center O of the
rotary suction cup and the emitter position of the optical calibrator, the range s of
the optical calibrator, the ratio k of the motor to the rotary suction cup,
and the flat edge calibration threshold t are set for initialization
```
↓
```
Real-time acquisition of the motor angle $α_i$ and the optical calibrator shading
amount $s_i$ during the rotation of the wafer to be measured on the rotating suction
cup, and thereby calculating the rotation angle $θ_i$ of the wafer to be measured and
the distance $ρ_i$ between the edge of the wafer to be measured and the center O of
said rotating suction cup
```
↓

◇ The distance $ρ_i$ between the edge of said wafer to be measured and the center O of said rotating suction cup is within a specified range NO → Gives shutdown indication of wafer out of position

YES ↓

◇ Whether the rotation angle $θ_i$ of said wafer to be measured and the distance $ρ_i$ between the edge of said wafer to be measured and the center O of said rotating suction cup are rounded edge data or flat edge data ROUND EDGE DATA:
Calculate the radius deviation $ρ_p$ of the wafer center P to be measured with respect to the center O of the rotating suction cup and the phase deviation $θ_p$ of the wafer center P to be measured with respect to the center O of the rotating suction cup FLAT EDGE DATA:
Calculate the flat edge angle phase deviation $β$ based on the phase deviation $θp$ of the center P of the wafer to be measured relative to the center O of the rotating suction cup obtained from the rounded edge data before jumping

↓

Calibrating the placement position of the wafer to be measured using a radius deviation $ρ_p$ of said wafer center P to be measured relative to the center O of the rotating suction cup, a phase deviation $θ_p$ of said wafer center P to be measured relative to the center O of the rotating suction cup, and a phase deviation $β$ of said flat edge angle to be measured

Fig. 1

WAFER POSITIONING AND CORRECTION METHOD, SYSTEM, AND DEVICE

TECHNICAL FIELD

The present invention relates to the technical field of semiconductor wafer transfer equipment, and in particular refers to a wafer positioning and correcting method, system and device system and device.

BACKGROUND TECHNOLOGY

The chip processing industry has been developing rapidly in recent years, and in the process of chip production, different processes are carried out when the wafers will be transported in various process cavities. In the wafer handling process, theoretically, the relative position of the wafer and the mechanical hand handling the wafer is fixed. Theoretically, the relative positions of the wafer and the robot handling the wafer are fixed. However, in practice, after multiple processes and multiple handling, the wafer will deviate from the center of the robot's fingers, resulting in the loss of the wafer or the loss of the wafer finger center position caused by the phenomenon of falling or collision. To ensure the consistency and accuracy of the final placement of wafers, the robot needs to automatically correct the position of the wafer on the finger. To ensure the consistency and accuracy of the final placement of wafers, it is necessary for the robot to automatically correct the position of the wafers on the fingers, this dynamic deskewing technology is called active wafer centering (AWC), AWC is a dynamic deskewing technology. This dynamic deskewing technique is called Active Wafer Centering (AWC), and the automatic wafer centering function of AWC is aimed at the offset of the actual center and the reference center in the process of wafer transfer by the manipulator. The AWC wafer auto-centering function is designed to automatically correct the offset between the actual center and the reference center during the transfer of wafers by the manipulator to ensure that the wafers are accurately transported to the specified position.

In the existing technology, the dynamic deviation correction method of wafer handling has adopted two high-precision laser sensors, and needs to go through a complicated process. The existing technology, the dynamic deviation correction method of wafer handling uses two high-precision laser sensors, and needs to be calibrated and calculated after a more complicated to get the final deviation value, and the calculation process is carried out at the same time the center of the circle. In the process of calculation, both circular center correction and direction calibration correction are carried out, which makes the correction process complicated and the error is easy to generate interference, and the calibration accuracy is low.

CONTENT OF THE INVENTION

To this end, the technical problem to be solved by the present invention is to overcome the dynamic deskewing method for wafer handling in the prior art the problem of low accuracy, and for commonly used wafer silicon wafers having flat grooves, to provide a wafer positioning deskewing method, where the wafer to be measured wafer includes a round edge and a flat edge, comprising the following steps:

S1: For the dimensions of the wafer to be inspected, a preset coaxiality error of the wafer to be tested at the round center P and the rotating suction cup center O Δ, the radius R of the wafer to be tested, the distance $L_0$ between the rotary suction cup center O and the emitter position of the optical calibrator, the optical calibrator range s, a motor to rotary suction cup ratio k and a flat edge calibration threshold t for initialization setting.

S2: The motor angle $\alpha_i$ during rotation of the wafer to be measured on the rotary suction cup is captured in real time with the optical calibrator shading amount $s_i$, and thereby calculating the rotation angle $\theta_i$ of the wafer to be measured and the distance between the edge of the wafer to be measured and the center O of the rotary suction cup $\rho_i$.

S3: Determining whether the distance $\rho_i$ between the edge of the wafer to be measured and the center O of the rotating suction cup is within a specified range: If within the specified range, continue with step S4; if not, give a shutdown indication that the wafer is out of position;

S4: determining whether the rotation angle $\theta_i$ of the wafer to be measured and the distance $\rho_i$ between the edge of the wafer to be measured and the center of the rotating suction cup O whether the distance $\rho_i$ of the edge of the wafer to be measured is rounded edge data or flat edge data:

If it is rounded edge data, calculating the polar coordinate position of the wafer-to-be-tested circle center P and the rotating suction cup center O on the polar coordinate system deviation $(\beta_p, \theta_p)$, where ρp is the radius deviation of the wafer center P to be measured with respect to the rotating suction cup center O, $\theta_p$ is the radius deviation of the wafer $\theta_p$ is the phase deviation of the wafer center P to be measured with respect to the center O of the rotating suction cup;

In the case of flat edge data, the phase deviation of the wafer center P to be measured relative to the center O of the rotating suction cup is calculated from the round edge data obtained before the jump. center O. The phase deviation of the flat edge angle phase deviation β is calculated;

S5: using the radius deviation of the to-be-tested wafer center P relative to the rotating suction cup center O, the to-be-tested wafer circle phase deviation of the center P with respect to the center O of the rotating suction cup and phase deviation of the flat edge angle for the placement of the wafer to be tested for calibration;

wherein the wafer to be tested is placed on a rotary suction cup, the rotary suction cup is connected to a motor, the rotary suction cup carries the rotating suction cup is connected to a motor, the rotating suction cup rotates the wafer to be tested, the edge of the wafer to be tested is provided in a calibration area between a transmitter and a receiver of an optical calibrator the edge of the wafer to be tested is set in the calibration area between the transmitter and the receiver of the optical calibrator, the optical calibrator shading amount $s_i$ being the shading length of the edge of the wafer to be tested between the transmitter and the receiver of the optical calibrator between the transmitter and the receiver of the optical calibrator.

In an embodiment of the present invention, the wafer turn angle $\theta_i$ is calculated as:

$$\theta_i = \frac{\alpha_i}{k}$$

wherein $\alpha i$ denotes the motor turn angle; and k denotes the motor to rotating suction cup ratio.

In an embodiment of the present invention, the distance $\rho_i$ between an edge of the wafer to be measured and the center O of the rotary suction cup is calculated as:

$$\rho_i = L_0 + s_i$$

wherein $L_0$ denotes the distance between the rotating suction cup center O and the emitter position of an optical calibrator; $s_i$ denotes the optical calibrator calibrator shading amount.

In an embodiment of the present invention, in S3, the specified range is:

$$R - 0.5 < \rho_i < R + 0.5\Delta$$

wherein R denotes a wafer radius; $\Delta$ denotes a predetermined coaxiality error between the wafer center P to be measured and the center O of the rotating suction cup error.

In an embodiment of the present invention, the predetermined coaxiality error between the wafer center P to be measured and the center O of the rotating suction cup is in the range of O of the center of the rotating suction cup is in the range of:

$$\Delta < s$$

wherein s represents the optical calibrator range.

In an embodiment of the present invention, in S4, the judgement method of jumping to flat edge data or rounded edge data comprises: based on the according to the rotation angle of the wafer to be measured for the current sample, the previous two samples, and the edge of the wafer to be measured and the center of the rotating suction cup O the distance between the edge of the wafer to be measured and the center O of the rotating suction cup is judged to: satisfy $$\frac{\rho_i - \rho_{i-1}}{\theta_i - \theta_{i-1}} < -t, \left|\frac{\rho_{i-1} - \rho_{i-2}}{\theta_{i-1} - \theta_{i-2}}\right| < t$$

The rounded edge data jumps to flat edge data when the conditions of the $$\left|\frac{\rho_i - \rho_{i-1}}{\theta_i - \theta_{i-1}}\right| < t, \frac{\rho_{i-1} - \rho_{i-2}}{\theta_{i-1} - \theta_{i-2}} > t$$

condition, the flat edge data jumps to rounded edge data; where $\theta_i$ is the currently sampled to-be-measured wafer $\theta_i$ is the rotation angle of the currently sampled wafer to be measured; $\theta_{i-1}$ is the rotation angle of the last sampled wafer to be measured of $\theta_i$; $\theta_{i-2}$ is the rotation angle of the last sampled wafer to be measured of $\theta_{i-1}$; and of $\theta_{i-1}$ is the rotation angle of the last sampled wafer to be measured; $\theta_{i-2}$ is the rotation angle of the last sampled wafer to be measured of $\theta_{i-1}$; $\rho_i$ is the distance between the edge of the currently sampled wafer to be measured and the center O of the rotating sucker; $\rho_{i-1}$ is the distance between the edge of the last sampled wafer to be measured of $\rho_i$ and the center O of the rotating suction cup; $\rho_{i-2}$ is the distance between the last distance between the edge of the sampled wafer to be measured and the center O of the rotating suction cup.

In an embodiment of the present invention, the radius deviation pp is calculated according to the least squares method:

$$\rho_p = \sqrt{x_c^2 + y_c^2}$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} +$$

$$\sum \rho_i \cos(\theta_i)/N$$

$$y_c = \frac{\sum v_i^2 u_i \sum u_i v_i - \sum v_i^3 \sum u_i^2 - \sum u_i v_i^2 \sum u_i^2 + \sum u_i^3 \sum u_i v_i}{2\left[\left(\sum u_i v_i\right)^2 - \sum u_i^2 \sum v_i^2\right]} +$$

$$\sum \rho_i \sin(\theta_i)/N$$

$$u_i = \rho_i \cos(\theta_i) + \sum \rho_i \cos(\theta_i)/N$$

$$v_i = \rho_i \sin(\theta_i) + \sum \rho_i \sin(\theta_i)/N$$

where $x_c$, $y_c$, $u_i$, and $v_i$ are transition variables; and N denotes the number of fit terms.

In one embodiment of the present invention, the phase deviation $\theta_p$ is calculated as $$\theta_p = \begin{cases} \arccos\left(\frac{x_c}{\rho_p}\right), & y_c \geq 0 \\ 2\pi - \arccos\left(\frac{x_c}{\rho_p}\right), & y_c < 0 \end{cases}$$

In one embodiment of the present invention, the flat edge angle phase deviation $\beta$ is calculated according to the least squares method:

$$\beta = \theta_p - \arctan(\hat{b}) + \frac{\pi}{2}$$

$$\hat{b} = \frac{N \cdot \sum x_i y_i - \left(\sum x_i\right)\left(\sum y_i\right)}{N \cdot \sum x_i^2 - \left(\sum x_i\right)^2}$$

$$x_i = \rho_i \cos(\theta_i)$$

$$y_i = \rho_i \sin(\theta_i)$$

wherein $\hat{b}$, $x_i$, $y_i$ are transition variables; N denotes the number of fitting terms.

Based on the same inventive concept, the present invention also provides a wafer positioning correction system comprising the following modules:

A data initialization module for, with respect to the dimensions of the wafer to be inspected, treating the measured wafer circle center P and the rotating suction cup center O a preset coaxiality error $\Delta$ of the wafer to be tested, a radius R of the wafer to be tested, a distance $L_0$ of the center O of the rotating suction cup from the emitter position of the optical calibrator, a distance $L_0$ of the optical calibrator from the emitter position of the optical calibrator, and a distance $L_0$ of the optical calibrator from the emitter position of the optical calibrator. a distance $L_0$ from the transmitter position of the optical calibrator, a range s of the optical calibrator, a ratio k of the motor to the rotary suction cup, and a flat edge calibration threshold t initialized to be set.

A data acquisition and calculation module for real-time acquisition of the motor rotation during rotation of the wafer to be measured on the rotary suction cup angle $\alpha_i$ and the optical calibrator shading amount $s_i$, and thereby calculating the rotation angle $\theta_i$ of the wafer to be measured and the distance between the edge of the wafer to be measured and the center O of the rotating suction cup $\rho_i$.

A wafer position deviation judgement module for judging whether the distance $\rho_i$ between the edge of the wafer to be measured and the center O of the rotary chuck distance $\rho_i$ is within a specified range: if it is within the specified range, continue with step S4; if it is not, give a wafer position deviation stop prompt.

A deviation parameter acquisition module for determining the rotation angle $\theta_i$ of the wafer to be measured and the edge of the wafer to be measured distance $\rho_i$ from the center O of the rotating suction cup is round edge data or flat edge data.

In case of circular edge data, calculate the polar position of the wafer circle center P to be measured with respect to the rotating suction cup center O on the polar coordinate system deviation $(\rho_p, \theta_p)$, where $\rho_p$ is the radius deviation $\rho_p$ of the wafer circle center P to be measured with respect to the rotating suction cup center O, and $\theta_p$ is the phase deviation of the wafer circle center P to be measured with respect to the rotating suction cup center O. $\theta_p$ is the phase deviation of the center of the wafer to be measured P relative to the center of the rotating suction cup O.

If the data is flat edge data, the phase deviation of the flat edge angle is calculated based on the phase deviation of the center of the wafer to be tested P relative to the center of the rotating suction cup O obtained from the circular edge data before the jump; the wafer position correction module is used to calibrate the placement position of the wafer to be tested using the radius deviation of the center of the wafer to be tested P relative to the center of the rotating suction cup O, the phase deviation of the center of the wafer to be tested P relative to the center of the rotating suction cup O and the phase deviation of the flat edge corner to calibrate the placement position of the wafer undergoing testing.

In particular, the wafer to be tested is placed on a rotating suction cup, the rotating suction cup is connected to a motor, the rotating suction cup drives the wafer to be tested to rotate, the edge of the wafer to be tested is arranged in the calibration area between the transmitter and receiver of the optical calibrator, and the optical shading quantity si of the optical calibrator is the shading length between the edge of the wafer to be tested and the transmitter and receiver of the optical calibrator.

The present invention also provides a wafer positioning and guiding device comprising the wafer positioning and guiding system.

The above technical solution of the present invention has the following advantages over the prior art:

The wafer positioning and correction method, system and device described in the present invention improve the accuracy of correction by correcting the central position radius deviation pp, central position phase deviation Op and flat corner phase deviation $\beta$, and can ensure that the final placement positions of all wafers to be inspected remain consistent, achieving a dynamic correction effect.

A semiconductor wafer transfer device has a wafer positioning deskewing method via steps of initially setting parameters for the size of a wafer to be measured; collecting a motor rotational angle initialization settings for the size of the wafer to be measured; collecting motor angle data $\alpha_i$ and optical calibrator optical calibrator shading length data $s_i$; calculating the wafer turning angle $\theta_i$ and the wafer edge to center of rotation distance data $\rho_i$. The distance between the edge of the wafer to be measured and the center of the rotating suction cup is determined to the center of the rotating suction cup is within the specified range: If it is within the specified range, use the radius of the center P of the wafer to be measured relative to the center O of the rotating suction cup. The radius deviation $\rho_p$ from the center of the rotary suction cup O, the center of the wafer to be measured P phase O, the phase deviation $\theta_p$ from the center of the wafer to be measured, and the phase deviation $\beta$ from the edge of the flat corner. The placement position of the wafer to be measured is calibrated by the phase deviation $\beta$ of the wafer center P relative to the center O of the rotary chuck. This invention This invention can ensure that the final placement position of all wafers to be detected is consistent and achieve the dynamic deviation correction effect. This invention can ensure that the final placement position of all wafers to be inspected is consistent and achieve the effect of dynamic deviation correction.

BRIEF DESCRIPTION OF THE DRAWINGS

In order to make the contents of the present invention more easily and clearly understood, the following is a further detailed description of the present invention according to specific embodiments of the present invention and in conjunction with the accompanying drawings, the present invention is described in further detail, wherein FIG. 1 is a flowchart of a wafer positioning deskew method provided in an embodiment of the present invention.

Figure 2:
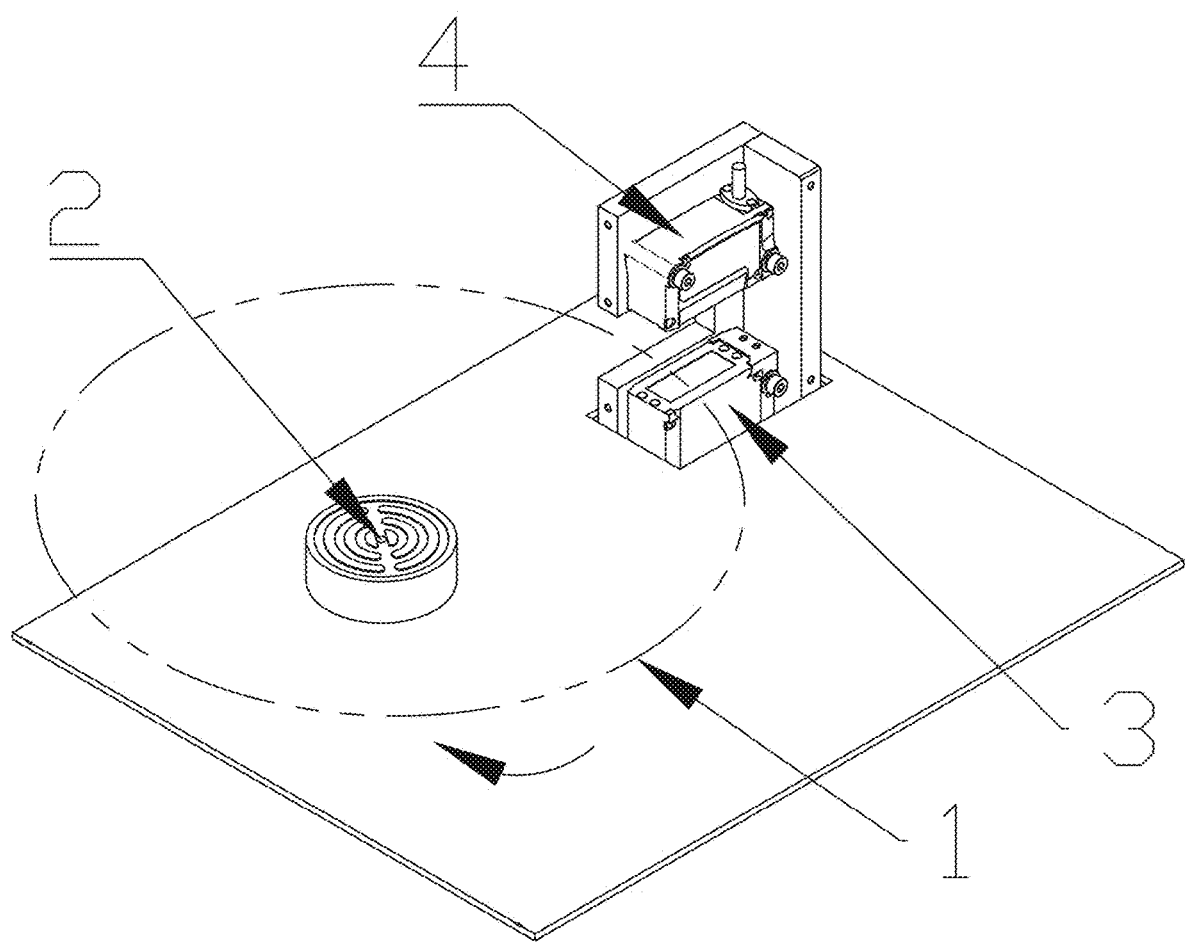
FIG. 2 is a data acquisition device provided in embodiments of the present invention.

A DESCRIPTION OF THE ACCOMPANYING DRAWINGS CALLOUTS SHOWS 1 a wafer to be measured
11 an edge of the wafer to be measured
2 a rotating suction cup
3 laser micrometry instrument
31 transmitter
32 receiver

DETAILED DESCRIPTION OF THE PREFERRED EMBODIMENT

The present invention is further described below in connection with the accompanying drawings and specific embodiments so that those skilled in the art may better understand the present invention and be able to implement it, but the exemplified embodiments are not intended to be a limitation of the present invention.

Example 1

Referring to FIGS. 1 to 5, a wafer positioning and correcting method of the present invention, wherein the wafer to be measured comprises a round edge and a flat edge, comprises the following steps S1, S2, S3, S4, and S5.

S1: with respect to the size of the wafer to be inspected, a preset coaxiality error of the wafer to be tested at the circular center P and the rotating suction cup center O Δ, the radius R of the wafer to be tested, the distance $L_0$ between the rotary suction cup center O and the emitter position of the optical calibrator, the optical calibrator range s, a motor to rotary suction cup ratio k and a flat edge calibration threshold t for initialization setting.

Figure 3:
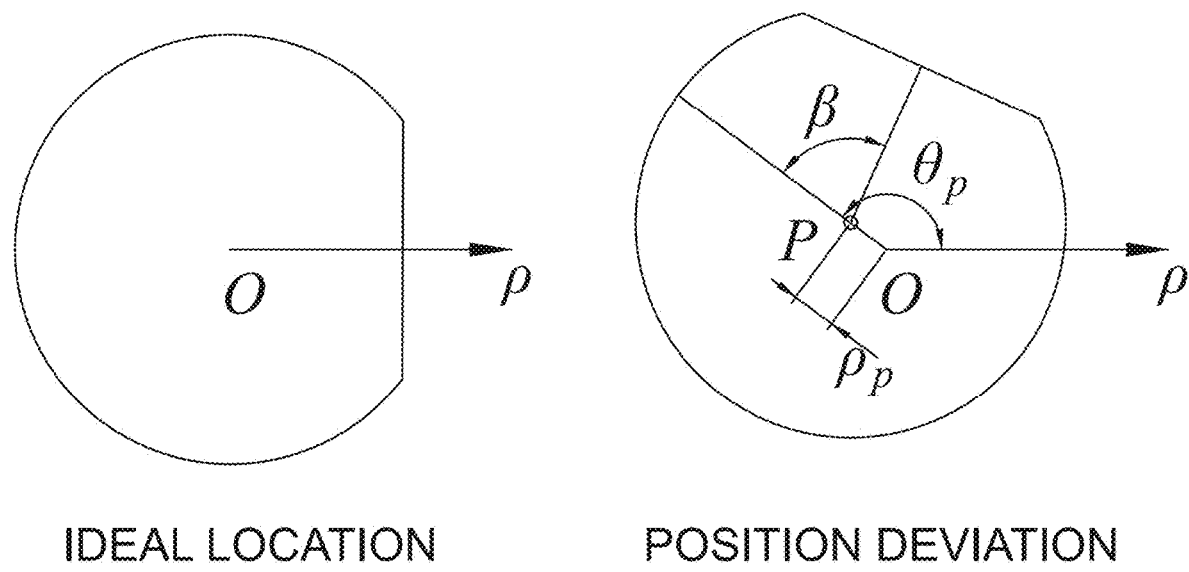
FIG. 3 is a schematic diagram of an ideal position and a position deviation of a wafer in an embodiment of the present invention, wherein the position deviation comprises a wafer radius deviation $\rho_p$ of the position P of the center of the wafer relative to the position O of the center of the rotating suction cup, phase deviation of the position P of the center of the wafer relative to the position O of the center of the rotating suction cup O, a phase deviation $\theta_p$ of the wafer center position P relative to the rotating suction cup center position O, and an angular phase deviation $\beta$ of the flat edge normal relative to the PO line.

S2: Use the data acquisition device shown in FIG. 2 to collect in real time the wafer to be measured during rotation on the rotary suction cup the motor rotation angle $\alpha_i$ and optical calibrator shading amount $s_i$, and thereby calculate the rotation angle $\theta_i$ of the wafer to be measured and the edge of the wafer to be measured distance $\rho_i$ from the center O of the rotating suction cup;

S3: determining whether the distance $\rho_i$ between the edge of the wafer to be measured and the center O of the rotating suction cup is within a specified range: If within the specified range, continue with step S4; if not, give a shutdown indication that the wafer is out of position;

S4: determining whether the rotation angle $\theta_i$ of the wafer to be measured and the distance $\rho_i$ between the edge of the wafer to be measured and the center of the rotating suction cup O whether the distance $\rho_i$ is round edge data or flat edge data:

As shown in FIG. 3, if it is rounded edge data, calculating the center P of the wafer to be measured and the center O of the rotating suction cup in the polar coordinate system of the Polar position deviation $(\rho_p, \theta_p)$, where $\rho_p$ is the radius deviation of the wafer center P to be measured with respect to the center O of the rotating suction cup, $\theta_p$ is the phase deviation of the wafer center P to be measured with respect to the center O of the rotating suction cup.

In the case of flat edge data, the wafer center P to be measured relative to the center of the rotating suction cup obtained from the rounded edge data before jumping is used to center O to calculate the phase deviation of the flat edge corner phase deviation.

S5: using the radius deviation of the to-be-tested wafer center P relative to the rotating suction cup center O, the to-be-tested wafer circle center P relative to the center O of the rotating suction cup and the flat edge angle phase deviation for the placement of the wafer to be tested calibration.

As shown in FIG. 2, the data acquisition device comprises a wafer to be measured 1, a rotary suction cup 2 and a laser micrometer 3. The optical calibrator used in this example is a laser micrometer. The wafer to be measured 1 is placed on the rotary suction cup 2, the rotary suction cup 2 is connected to a motor. The rotary suction cup 2 drives the wafer to be tested 1 to rotate. The wafer edge 11 of the wafer to be tested is provided in the launching the wafer edge 11 to be tested is set in the calibration area between the transmitter 31 and the receiver 32. The optical calibrator shading amount $s_i$ is the amount of the wafer edge 11 to be tested located in the calibration area between the transmitter 31 and the receiver 32. The optical calibrator shading amount $s_i$ is the shading length of the wafer edge 11 to be measured between the transmitter 31 and the receiver 32.

In step S2, the wafer turn angle $\theta_i$ is calculated as:

$$\theta_i = \frac{\alpha_i}{k}$$

wherein $\alpha_i$ denotes the motor angle of rotation; k denotes the motor to rotary suction cup ratio.

Figure 4:
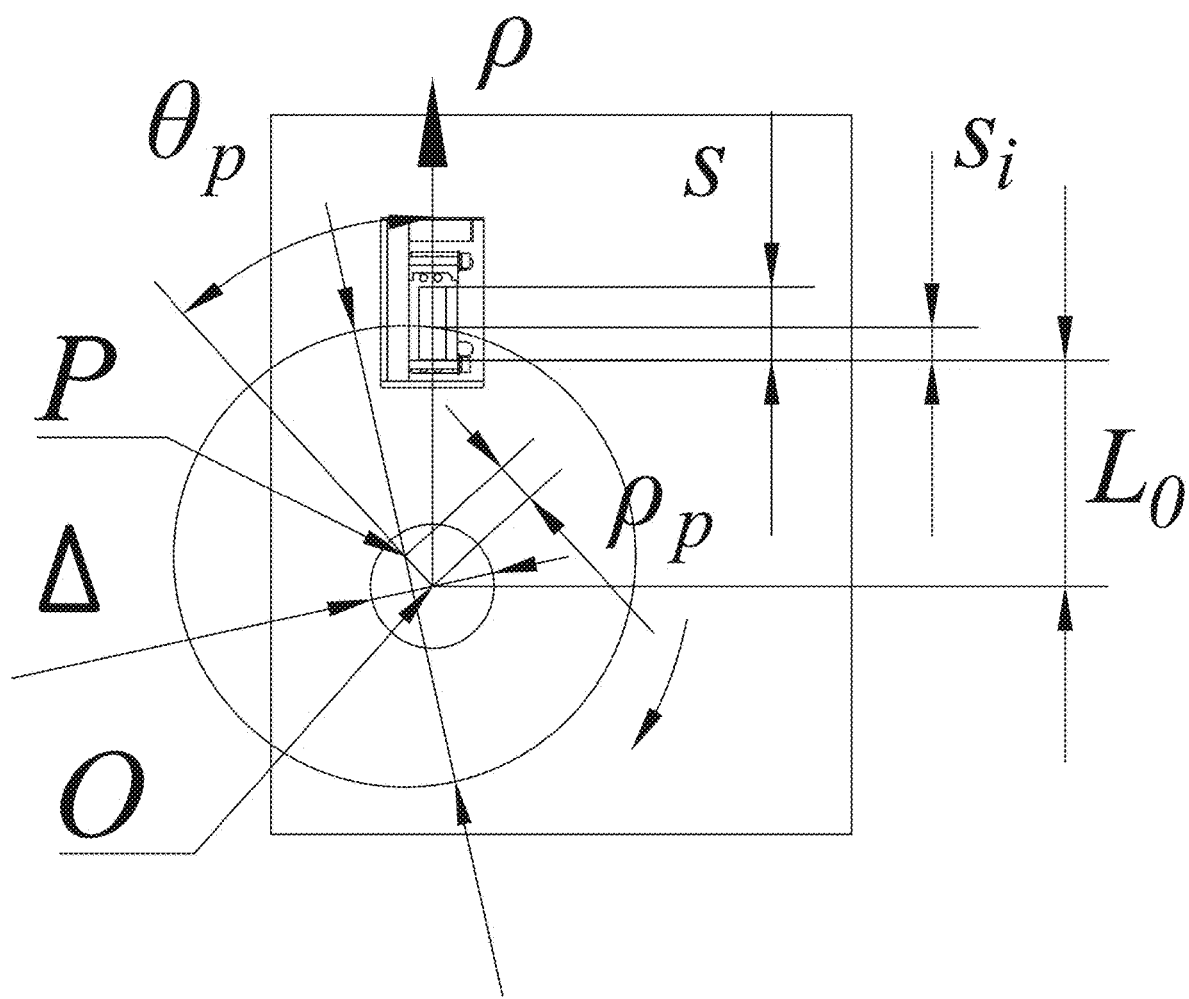
FIG. 4 is the initial data after collection and collation in an embodiment of the present invention.
Figure 5:
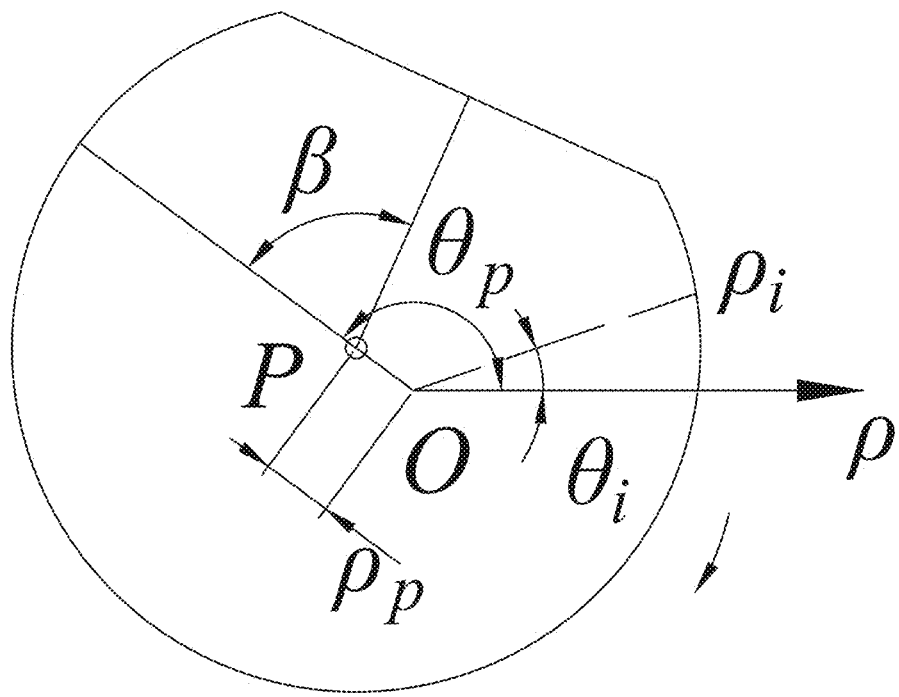
FIG. 5 is a schematic diagram of the deviation of the wafer center P relative to the center O of the rotating suction cup in an embodiment of the present invention.

In FIG. 4, the distance $\rho_i$ between the edge of the wafer to be measured and the center O of the rotary suction cup is calculated as:

$$\rho_i = L_0 + s_i$$

$L_0$ denotes the distance between the rotating suction cup center O and the emitter position of the optical calibrator and $s_i$ denotes the optical calibrator shading amount.

In step S3, in determining whether the distance $\rho_i$ between the edge of the wafer to be measured and the rotary chuck center O is within a specified range: if it is within the specified range, the distance $\rho_i$ is within the specified range: if within the specified range, continue to step S4; the specified range is:

$$R - 0.5\Delta < \rho_i < R + 0.5\Delta$$

R denotes the radius of the wafer. Δ denotes a predetermined coaxiality error between the wafer center P to be measured and the center O of the rotating suction cup difference. The range of values of the preset coaxiality error Δ of the wafer center P to be measured and the center O of the rotating suction cup is:

$$\Delta \leq s$$

s denotes the optical calibrator range.

In step S4, the judgement method of jumping to flat-edge data or rounded-edge data comprises: based on the current sample, the previous two samples, the rotation angle of the wafer to be measured, and the distance between the edge of the wafer to be measured and the center O of the rotating suction cup is judged: full $$\frac{\rho_i - \rho_{i-1}}{\theta_i - \theta_{i-1}} < -t, \left|\frac{\rho_{i-1} - \rho_{i-2}}{\theta_{i-1} - \theta_{i-2}}\right| < t$$

The rounded edge data jumps to flat edge data when the condition of the $$\left|\frac{\rho_i - \rho_{i-1}}{\theta_i - \theta_{i-1}}\right| < t, \frac{\rho_{i-1} - \rho_{i-2}}{\theta_{i-1} - \theta_{i-2}} > t$$

condition, the flat edge data jumps to rounded edge data; where $\theta_i$ is the currently sampled to-be-measured rotation angle of the currently sampled wafer to be measured; $\theta_{i-1}$ is the rotation angle of the last sampled wafer to be measured of $\theta_i$; $\theta_{i-2}$ is the last sampled $\theta_{i-2}$ is the angle of rotation of the last sampled wafer to be measured of $\theta_{i-1}$; $\rho_i$ is the distance between the edge of the currently sampled wafer to be measured and the center O of the rotating suction cup; $\rho_{i-1}$ is the distance between the edge of the last sampled wafer to be measured and the center O of the rotating suction cup; $\rho_{i-2}$ is the distance between the edge of the last sampled wafer to be measured and the center O of the rotating suction cup; $\rho_{i-1}$ is the distance between the edge of the last sampled wafer to be measured and the center O of the rotating suction cup; and the distance between the edge of the last sampled wafer to be measured of $\rho_i$ and the center O of the rotating suction cup.

If the angle of rotation $\theta_i$ of the wafer to be measured and the distance between the edge of the wafer to be measured and the center O of the rotating suction cup the distance $\rho_i$ is circular edge data:

Calculate the polar position deviation $(\rho_p, \theta_p)$ between the wafer center P to be measured and the center O of the rotating suction cup in a polar coordinate system, where $\rho_p$ is the radius deviation of the wafer center P to be measured with respect to the rotating suction cup center O, $\theta_p$ is the phase deviation of the wafer center P to be measured with respect to the rotating O, where $\rho_p$ is the radius deviation of the wafer center P to be measured relative to the rotating suction cup center O, $\theta_p$ is the phase deviation of the wafer center P to be measured relative to the rotating suction cup center O, wherein the radius deviation $\rho_p$ is calculated according to the least squares method:

$$\rho_p = \sqrt{x_c^2 + y_c^2}$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} + \sum \rho_i \cos(\theta_i)/N$$

$$y_c = \frac{\sum v_i^2 u_i \sum u_i v_i - \sum v_i^3 \sum u_i^2 - \sum u_i v_i^2 \sum u_i^2 + \sum u_i^3 \sum u_i v_i}{2\left[\left(\sum u_i v_i\right)^2 - \sum u_i^2 \sum v_i^2\right]} + \sum \rho_i \sin(\theta_i)/N$$

$$u_i = \rho_i \cos(\theta_i) + \sum \rho_i \cos(\theta_i)/N$$

$$v_i = \rho_i \sin(\theta_i) + \sum \rho_i \sin(\theta_i)/N$$

where $x_c$, $y_c$, $u_i$, and $v_i$ are transition variables; and N denotes the number of fit terms.

The phase deviation $\theta_p$ is calculated as follows:

$$\theta_p = \begin{cases} \arccos\left(\frac{x_c}{\rho_p}\right), & y_c \geq 0 \\ 2\pi - \arccos\left(\frac{x_c}{\rho_p}\right), & y_c < 0 \end{cases}$$

If the rotation angle $\theta_i$ of the wafer to be measured and the distance between the edge of the wafer to be measured and the center of the rotating suction cup O distance $\rho_i$ are flat edge data: the phase of the center P of the wafer to be measured relative to the center O of the rotating suction cup obtained based on the rounded edge data before the jump the phase deviation $\theta_p$, the phase deviation $\beta$ of the flat edge angle is calculated by the least squares method:

$$\beta = \theta_p - \arctan(\hat{b}) + \frac{\pi}{2}$$

$$\hat{b} = \frac{N \cdot \sum x_i y_i - \left(\sum x_i\right)\left(\sum y_i\right)}{N \cdot \sum x_i^2 - \left(\sum x_i\right)^2}$$

$$x_i = \rho_i \cos(\theta_i)$$

$$y_i = \rho_i \sin(\theta_i)$$

where $x_i$, $y_i$ are transition variables; and N denotes the number of fit terms.

Example II

Based on the same inventive concept as the debiasing method described in Example I, the present invention also provides a wafer positioning debiasing method. bias correction system comprising the following modules:

A data initialization module, for use in relation to the dimensions of the wafer to be inspected, a predetermined coaxiality error Δ between the center P of the wafer to be tested and the center O of the rotating suction cup the preset coaxiality error Δ of the wafer to be tested, the radius R of the wafer to be tested, the distance $L_0$ of the center O of the rotary suction cup from the emitter position of the optical calibrator, the range s of the optical calibrator, the distance $L_0$ of the motor to the rotary suction cup, and the distance $L_0$ of the motor to the emitter position of the optical calibrator. $L_0$, the optical calibrator range s, the motor to rotary suction cup ratio k and the flat edge verification threshold t are initialized;

A data acquisition and calculation module for real-time acquisition of the motor rotation during rotation of the wafer to be measured on the rotary suction cup angle $\alpha_i$ and optical calibrator shading amount $s_i$, and thereby calculating the rotation angle $\theta_i$ of the wafer to be measured and the edge of the wafer to be measured from the center O of the rotating suction cup $\rho_i$;

A wafer position deviation judgement module for judging the distance between the edge of the wafer to be measured and the center O of the rotary chuck distance $\rho_i$ is within a specified range: if within the specified range, continue with step S4; if not, give the wafer deviation position of the A deviation parameter acquisition module for determining whether a rotation angle $\theta_i$ of the wafer to be measured and an edge of the wafer to be measured distance $\rho_i$ from the center O of the rotating suction cup is round edge data or flat edge data:

If it is rounded edge data, calculating the polar coordinate position of the wafer-to-be-tested circle center P and the rotating suction cup center O on the polar coordinate system deviation $(\rho_p, \theta_p)$, where $\rho_p$ is the radius deviation $\rho_p$ of the wafer center P to be measured with respect to the center O of the rotating suction cup, $\theta_p$ is the radius deviation $\rho_p$ of the wafer $\theta_p$ is the phase deviation of the wafer center P to be measured with respect to the center O of the rotating suction cup;

In the case of flat edge data, the phase deviation of the center P of the wafer to be measured relative to the center O of the rotating suction cup is calculated based on the rounded edge data obtained before the jump. the phase deviation of the center O of the rotating chuck;

A wafer position correction module for using the radius deviation of the to-be-tested wafer center P with respect to the rotating suction cup center O the radius deviation of the wafer center P to be measured with respect to the center O of the rotating suction cup, the phase deviation of the wafer center P to be measured with respect to the center O of the rotating suction cup and the phase deviation of the flat-edge angle for the wafer to be measured the placement position of the wafer to be measured is calibrated;

wherein the wafer to be measured is placed on a rotary suction cup, the rotary suction cup is connected to a motor, the rotary suction cup carries the wafer to be measured the wafer-to-be-tested is rotated, the wafer-to-be-tested having an edge set between the transmitter and receiver of the optical calibrator for calibration of the wafer-to-be-tested the edge of the wafer to be tested is set in the calibration area between the transmitter and the receiver of the optical calibrator, the optical calibrator shading amount $s_i$ being the handing length of the edge of the wafer to be tested between the transmitter and the receiver of the optical calibrator. between the transmitter and receiver of the optical calibrator.

Example 3

The present invention also provides a wafer positioning deskew device comprising the wafer positioning deskew system described in Example II.

It should be appreciated by those skilled in the art that embodiments of the present application may be provided as methods, systems, or computer program products. Accordingly, the present application may take the form of fully hardware embodiments, fully software embodiments, or a combination of software and hardware aspects. embodiments, or a combination of software and hardware aspects. Further, the present application may take the form of a computer program that contains computer-usable program code on one or more computer-usable storage media (including a computer program that contains computer-usable program code). The application may also take the form of a computer program product implemented on one or more computer-usable storage media (including, but not limited to, disk memory, CD-ROM, optical memory, etc.) that contain computer-usable program code. in the form of a product.

The present application is made with reference to flowcharts and/or block diagrams of methods, devices (systems), and computer program products according to embodiments of the present application. diagrams and/or block diagrams according to embodiments of the present application. It should be understood that each of the flowcharts and/or block diagrams may be implemented by computer program instructions, as well as by computer program instructions, each flow and/or box in the flowchart and/or block diagram, and the combination of flows and/or boxes in the flowchart and/or block diagram. These computer program instructions may be provided instructions to a processor of a general-purpose computer, a specialized computer, an embedded processor, or other programmable data processing device to produce a machine. a machine such that the instructions executed through the processor of the computer or other programmable data processing device produce a process flow or multiple processes for implementing the flowchart. present the functions specified in the one process or multiple processes of the flowchart and/or the one box or multiple boxes of the block diagram.

These computer program instructions may also be stored in a computer-readable memory capable of directing the computer or other programmable data processing device to operate in a particular manner computer-readable memory that can direct a computer or other programmable data processing device to operate in a particular manner, such that the instructions stored in that computer-readable memory produce an article of manufacture comprising an instruction instructions stored in the computer-readable memory to produce an article of manufacture comprising an instruction device that implements a function specified in one or more processes of a flowchart and/or one or more boxes of a block diagram. plurality of boxes.

These computer program instructions may also be loaded onto a computer or other programmable data processing device, such that the computer or other programmable data processing device may be loaded onto the computer or other programmable data processing device, such that the computer or other programmable device to perform a series of operational steps to produce computer-implemented processing, such that the computer or the instructions executed on the computer or other programmable device provide instructions for realizing a process in one or more processes of a flowchart and/or one or more boxes of a block diagram, one or more boxes of a flowchart and/or one or more boxes of a block diagram.

Clearly, the foregoing embodiments are merely examples for clarity and are not a limitation of the embodiments. For one of ordinary skill in the art, other variations or changes may be made on the basis of the foregoing description. The above illustrations are not intended to be a limitation of the embodiments. It is neither necessary nor possible to exhaust all of the embodiments herein.

The invention claimed is:

1. A wafer positioning and correcting method, the wafer to be measured includes a round edge and a flat edge, characterized in that it includes the following steps:

S1: with respect to a dimension of the wafer to be measured, a predetermined coaxiality error $\Delta$ of a center P of the wafer to be measured and a center O of a rotating suction cup, a radius R of the wafer to be measured, a distance $L_0$ between the center O of the rotary suction cup and a emitter position of a optical calibrator, a optical calibrator range s, a transmission ratio k of a motor to the rotary suction cup, and a flat edge calibration threshold t are initialized and set;

S2: real-time acquisition of a motor angle $\alpha_i$ and a optical calibrator shading amount $s_i$ during a rotation of the wafer to be measured on the rotary suction cup, thereby calculating a rotation angle $\theta_i$ of the wafer to be measured and a distance $\rho_i$ between the edge of the wafer to be measured and the center O of the rotary suction cup;

S3: determining the distance $\rho_i$ between the edge of the wafer to be measured and the center O of the rotary suction cup is within a specified range: in response to determining that the distance $\rho_i$ between the edge of the wafer to be measured and the center O of the rotary suction cup is within the specified range; continuing with step S4;

S4: determine whether the distance $\rho_i$ is round edge data or flat edge data:
 if rounded edge data, then calculate a polar coordinate position deviation between the center P of the wafer to be measured and the center O of the rotating suction cup on a polar coordinate system $(\rho_p, \theta_p)$, where $\rho_p$ is a radius deviation of the wafer center P to be measured relative to the center O of the rotating suction cup, $\theta_p$ is phase deviation relative to the center O of the rotary suction cup; or
 if flat edge data, the phase deviation $\theta_p$ is the phase deviation of the center P of the wafer to be measured relative to the center O of the rotating suction cup obtained from the rounded edge data before a jump; wherein phase deviation $\theta_p$ is to calculate a flat edge angle phase deviation $\beta$;

S5: use the radius deviation $\rho_p$ of the center P of the wafer to be measured P relative to the rotating suction cup center O, the center P of the wafer to be measured P, phase deviation $\theta_p$ relative to the center O of the rotating suction cup, and the flat edge angle phase deviation $\beta$ to place the wafer to be measured for;
 wherein, the wafer to be measured is placed on a rotary suction cup, the rotary suction cup is connected to the motor, the rotary suction cup drives the wafer to be tested, wherein the edge of the wafer to be measured is set in the calibration area between a transmitter and a receiver of the optical calibrator, wherein the edge of the wafer to be measured is set in the calibration zone between a transmitter and a receiver of the optical calibrator, wherein the optical calibrator shading amount $s_i$ is a shading length of the edge of the wafer to be tested between the transmitter and the receiver of the optical calibrator, wherein the length of the shading of the wafer to be measured between the transmitter and the receiver of the optical calibrator.

2. The wafer positioning correction method according to claim 1, characterized in that the rotation angle of the wafer to be measured $\theta_i$ is calculated for:

$$\theta_i = \frac{\alpha_i}{k}$$

where $\alpha_i$ denotes a motor angle of rotation.

3. The wafer positioning and correcting method according to claim 1, characterized in that: the distance $\rho_i$ between the edge of the wafer to be measured and said center O of the rotary suction cup, the distance $\rho_i$ is calculated as:

$$\rho_i = L_0 + s_i$$

wherein $L_0$ denotes a distance between the rotary suction cup center O and a emitter position of an optical aligner; $s_i$ denotes a optical aligner shading amount.

4. The wafer positioning correction method according to claim 1, characterized in that in S3, the specified range is: $R - 0.5\Delta < \rho_i < R + 0.5\Delta$ wherein R denotes the radius of the wafer; $\Delta$ denotes a preset coaxial error between the center P of the wafer to be measured and the center O of the rotating suction cup.

5. The wafer positioning correction method according to claim 1, wherein the wafer center P to be measured and rotary suction cup center O have a preset coaxial error, wherein the preset coaxially error $\Delta$ of the wafer center P to be measured and rotary suction cup center O is in the range of: $\Delta < s$ wherein s denotes a range of a optical calibrator.

6. The wafer positioning and correcting method according to claim 1, characterized in that: in S4, a jumping to flat edge data or round edge data edge data judgment method comprises:

$$\frac{\rho_i - \rho_{i-1}}{\theta_i - \theta_{i-1}} < -t, \left|\frac{\rho_{i-1} - \rho_{i-2}}{\theta_{i-1} - \theta_{i-2}}\right| < t$$

according to a current sampling, the rotation angle of the wafer to be measured in a previous two samples and the distance between the wafer to be measured and the edge of the wafer to be measured and the distance between the edge of the wafer to be measured and the center O of the rotating suction cup are judged: when a condition is satisfied, the rounded edge data is jumped to flat edge data;

$$\left|\frac{\rho_i - \rho_{i-1}}{\theta_i - \theta_{i-1}}\right| < t, \left|\frac{\rho_{i-1} - \rho_{i-2}}{\theta_{i-1} - \theta_{i-2}}\right| > t$$

when the conditions are satisfied, the flat edge data is jumped to round edge data wherein $\theta_i$ is the rotation angle of the currently sampled wafer to be measured; $\theta_{i-1}$ is the rotation angle of the last sampled wafer to be measured of $\theta_i$; $\theta_{i-2}$ is the rotation angle of the last sampled wafer to be measured of $\theta_{i-1}$; $\theta_{i-1}$ is the rotation angle of the last sampled wafer to be measured of $\theta_i$; $\theta_{i-2}$ is the rotation angle of a last sampled wafer to be measured of $\theta_{i-1}$; $\rho_i$ is the distance between the edge of the currently sampled wafer to be measured and the center O of the rotary suction cup;

wherein O is from the center of the rotating suction cup; $\rho_{i-1}$ is the distance between the edge of the last sampled wafer to be measured of $\rho_i$ and the center of the rotating suction cup O the distance between the edge of the last sampled wafer to be measured of $\rho_i$ and the center O of the rotating suction cup; $\rho_{i-2}$ is the distance between the edge of the last sampled wafer to be measured of $\rho_i$ and the center O of the rotating suction cup.

7. The wafer positioning deviation correction method according to claim 1, characterized in that: calculating the semi diameter deviation $\rho_p$:

$$\rho_p = \sqrt{x_c^2 + y_c^2}$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} +$$

$$\sum \rho_i \cos(\theta_i)/N$$

$$y_c = \frac{\sum v_i^2 u_i \sum u_i v_i - \sum v_i^3 \sum u_i^2 - \sum u_i v_i^2 \sum u_i^2 + \sum u_i^3 \sum u_i v_i}{2\left[\left(\sum u_i v_i\right)^2 - \sum u_i^2 \sum v_i^2\right]} +$$

$$\sum \rho_i \sin(\theta_i)/N$$

$$u_i = \rho_i \cos(\theta_i) + \sum \rho_i \cos(\theta_i)/N$$

$$v_i = \rho_i \sin(\theta_i) + \sum \rho_i \sin(\theta_i)/N$$

where $x_c$, $y_c$, $u_i$, and $v_i$ are transition variables; N denotes the number of fit terms.

8. The wafer positioning correction method according to claim 7, characterized in that: the phase deviation $\theta_p$ is calculated as:

$$\theta_p = \begin{cases} \arccos\left(\frac{x_c}{\rho_p}\right), & y_c \geq 0 \\ 2\pi - \arccos\left(\frac{x_c}{\rho_p}\right), & y_c < 0 \end{cases}.$$

9. The wafer positioning correction method according to claim 1, wherein: calculating the flat edge angle phase deviation $\beta$:

$$\beta = \theta_p - \arctan(\hat{b}) + \frac{\pi}{2}$$

$$\hat{b} = \frac{N \cdot \sum x_i y_i - \left(\sum x_i\right)\left(\sum y_i\right)}{N \cdot \sum x_i^2 - \left(\sum x_i\right)^2}$$

$$x_i = \rho_i \cos(\theta_i)$$

$$y_i = \rho_i \sin(\theta_i)$$

where $\hat{b}$, $x_i$ and $y_i$ are transition variables; N denotes the number of fitted terms.

10. A wafer positioning guiding system comprising the following modules of:

a data initialization module for, with respect to dimensions of a wafer to be measured, preset coaxial error $\Delta$, a radius R of the wafer to be measured, a distance O of a center of a rotary suction cup from a transmitter position of a optical calibrator distance $L_0$, optical calibrator range s, motor to rotary suction cup transmission ratio k and flat edge calibration threshold t initialized setting;

a data acquisition and calculation module for real-time acquisition of a motor angle $\alpha_i$ of the wafer to be measured during rotation on the rotary suction cup with a optical calibrator shading amount $s_i$, and thereby calculating a rotation angle $\theta_i$ of the wafer to be measured and a distance $\rho_i$ between the edge of the wafer to be measured and the rotating center O of the suction cup, the distance;

$\rho_i$ of the edge of the wafer to be measured from the center O of the rotating suction cup;

a wafer position deviation judgement module for judging whether the distance $\rho_i$ between the edge of the wafer to be measured and the rotating suction cup center O is within a specified range;

a deviation parameter acquisition module for determining whether the distance $\rho_i$ between the edge of the wafer to be measured and the center O of the rotary suction cup are round edge data or flat edge data:

if it is rounded edge data, calculating a polar coordinate position deviation between the wafer center P to be measured and the rotating suction cup center O in a polar coordinate system $(\rho_p, \theta_p)$, where $\rho_p$ is a radius deviation of the wafer center P to be measured relative to the rotating suction cup center O, $\theta_p$ is phase deviation relative to the center O of the rotating suction cup;

in case of flat edge data, the phase deviation $\theta_p$ is the phase deviation of the wafer center P relative to the center O of the rotating suction cup obtained from the rounded edge data before a jump, the phase deviation $\theta_p$ to calculate a flat edge angle phase deviation $\beta$;

a wafer position correction module for using a radius deviation $\rho_p$ of the to-be-measured wafer center P relative to the rotating suction cup center O, phase deviation $\theta_p$ of the center P of the wafer to be measured P relative to the center O of the rotating suction cup, and the flat edge angle phase deviation $\beta$ for calibrating the to-be-tested wafer placement position; and wherein the wafer to be measured is placed in a calibrated position wherein the wafer to be measured is placed on the rotary suction cup, the rotary suction cup is connected to the motor, the rotary suction cup drives the wafer to be measured the edge of the wafer to be measured is set in the calibration area between a transmitter and a receiver of the optical calibrator, wherein the edge of the wafer to be measured is set in the calibration area between a transmitter and a receiver of the optical calibrator, the optical calibrator shading amount $s_i$ is the amount of light that the edge of the wafer to be tested is located between the transmitter and the receiver of the optical calibrator, wherein the optical calibrator shading amount $s_i$ is a shading length of the edge of the wafer to be measured between the transmitter and receiver of the optical calibrator.

11. The wafer positioning guiding system of claim 10 wherein the wafer positioning guiding system is implemented as a wafer positioning deskew device as claimed in claim 10.

\* \* \* \* \*